United States Patent [19]

Bergstrom et al.

[11] Patent Number: 4,837,457
[45] Date of Patent: Jun. 6, 1989

[54] HIGH VOLTAGE POWER TRANSISTOR CIRCUITS

[75] Inventors: Michael J. Bergstrom, Carshalton; Derek J. Gent, Wallington, both of England

[73] Assignee: U.S. Philips Corp., New York, N.Y.

[21] Appl. No.: 132,536

[22] Filed: Dec. 14, 1987

[30] Foreign Application Priority Data

Dec. 19, 1986 [GB] United Kingdom ............... 8630406
Dec. 19, 1986 [GB] United Kingdom ............... 8630407
Dec. 19, 1986 [GB] United Kingdom ............... 8630408

[51] Int. Cl.$^4$ ............... H03K 17/60; H03K 3/01; H03K 5/153; H03K 17/56
[52] U.S. Cl. ............... 307/253; 307/270; 307/241; 307/296.1; 307/362
[58] Field of Search ............... 307/253, 241, 242, 243, 307/244, 362, 363, 296.1, 296.2, 296.3, 314, 270; 323/289

[56] References Cited

U.S. PATENT DOCUMENTS

| | | | |
|---|---|---|---|
| 4,213,068 | 7/1980 | Ahmed | 323/289 |
| 4,227,099 | 10/1980 | Houkes | 323/289 |
| 4,540,933 | 9/1985 | Teuling | 323/271 |
| 4,562,361 | 12/1985 | Hattori et al. | 307/270 |
| 4,564,769 | 1/1986 | Melamed | 307/253 |
| 4,701,631 | 10/1987 | Chieli | 323/289 |

FOREIGN PATENT DOCUMENTS

0115682 8/1984 European Pat. Off.
1234607 6/1971 Netherlands.

OTHER PUBLICATIONS

Hower, "A New Method of Characterizing the Switching Performance of Power Transistor", Industry Application Society IEE-IAS 1978.

Primary Examiner—Stanley D. Miller
Assistant Examiner—Trong Quang Phan
Attorney, Agent, or Firm—Bernard Franzblau

[57] ABSTRACT

A high voltage power transistor circuit composed of a pair of transistors (TR1, TR2) serially connected through an inductor (L) to a supply voltage. Associated components are connected to the transistors which determine various periods of operation. In order to ensure that the transistors (TR1, TR2) are rendered non-conducting simultaneously, sensors (S1, S2) sense their change in base current to produce pulses in monostable multivibrators (M1, M2) whose relative phases are compared in a digital phase comparator (PC). The drive for each transistor (TR1, TR2) is provided by an associated driver stage (DR1, DR2) via an associated device (DC1, DC2) having a characteristic used to control the cut-off of its associated transistor. One of the devices (DC2) has a variable characteristic which is controlled by the output of the phase comparator (PC) to ensure the required simultaneous non-conduction of the transistors.

19 Claims, 9 Drawing Sheets

HIGH VOLTAGE POWER TRANSISTOR CIRCUITS

BACKGROUND OF THE INVENTION

The invention relates to a circuit arrangement comprising a high voltage bipolar power transistor, control means for repeatedly cutting-off said transistor, which control means is connected to a signal source for producing a drive signal for said transistor, said control means comprising a device having a characteristic which is used to control said drive signal, and a comparison stage for controlling the characteristic of said device.

A circuit arrangement of the above type is described in U.S. Pat. No. 4,540,933 (9/10/85) The arrangements described in that patent are concerned with the control of two serially connected transistors where the voltage at the junction of the two transistors is sensed and compared with a reference voltage. The resulting comparison is used to control the characteristic of one or each device associated with a transistor which in this case consist of delay devices whose characteristic is their delay period. The nature of the operation of the arrangement is to ensure that the two transistors are simultaneously rendered non-conducting. The operation of this arrangement relies on the output circuit being balanced with an inductor connected to the main current path electrodes of the two switches which are not connected to eaach other. Although such an arrangement might be quite satisfactory when operating at a single frequency it is not so satisfactory in the case where the arrangement is intended to operate at different flyback times, such as in the case of a line output stage of a data graphics display where it is desired to obtain supplies from the line output transformer which is formed in part by the above inductors and where a number of taps have to be provided to cater for the changes in flyback time. In addition account is taken of the relationship between the signal source and the switching of the switches which could lead to phase changes with time. A simlar circuit arrangement is also shown in published European Patent Application No. 0 115 682 A1 and which has the same problems.

SUMMARY OF THE INVENTION

It is an object of the present invention to provide a circuit arrangement of the type described in the opening paragraph which can overcome the above problems.

The invention provides a circuit arrangement comprising a high voltage bipolar power transistor, control means for repeatedly cutting-off said transistor, which control means is connected to a signal source for producing a drive signal for said transistor, said control means comprising a device having a characteristic which is used to control said drive signal, and a comparison stage for controlling the characteristic of said device, characterised in that said arrangement additionally comprises sensor means for sensing the rate of change of base current of said transistor each time said transistor is cut off, means for applying the sensing signal so produced to a first input of said comparison stage a second input of which receives a further time-related signal, said device controlling the instant of cut-off of said transistor in response to the resulting comparison between said sensing and said further signals.

The above arrangement has the advantage that the cut off of the transistor is locked to a further time related signal in a relatively simple manner which can be used to overcome phase changes.

Such an arrangement may further comprise a second high voltage bipolar power transistor serially connected with said first mentioned transistor, second control means for repeatedly cutting off said second transistor, which second control means is connected to said signal source for producing a drive signal for said second transistor, said second control means comprising a second device having a characteristic corresponding to that of said first mentioned device which is used to control the drive signal for said second transistor, characterised in that said arrangement additionally comprises second sensor means for sensing the rate of change of base current of said second transistor each time said second transistor is cut-off, and means for applying the second sensing signal so produced to said second input of said comparison stage to form said further time-related signal, said comparison stage comparing the phase relationship between said first and second sensing signals to produce the control for the characteristic of said first device to ensure that said first and second transistors are cut-off substantially simultaneously. This has the advantage that by not having to sense the voltage at the junction of the two transistors, these transistors do not have to be part of a balanced circuit and a single load, such as the primary of a transformer, can be connected between the switches and its associated supply. It also has the advantage that if used in a balanced cicuit it is independent of any imbalance that might be present.

With such an arrangement the comparison stage may additionally control the characteristic of the second device.

In an alternative arrangement means may be additionally provided for applying pulses from said signal source to the second input of said comparison stage to form said further time related signal. With such an alternative arrangement the cut off of the transistor is locked to the signal source. The pulses from the signal source may then be applied by way of a delay stage to the second input of said comparison stage. The or each sensor may be connected to a respective pulse generator for producing a discrete pulse each time its associated transistor is cut-off. The or each pulse generator may then be a gated monostable multivibrator the gating signal for which is derived from said signal source.

The or each device may control the amplitude of the drive signal applied to the base of its associated transistor to control the charge storage time for that transistor. Where there are first and second transistors serially connected and first and second devices, the control exercised by the comparison stage on the first device may be used to substantially equalise the charge carrier storge times of the first and second transistors. Each amplitude control device may comprise a capacitor and a parallel resistive path, the resistive path in the first-mentioned device comprising a further transistor whose conductivity is controlled by said comparison stage. As an alternative the or each device may be a delay device, the delay period of the first mentioned device having its delay period varied under the control of said comparison stage.

An arrangement according to the invention may additionally comprise means for sensing power in said high voltage transistor, means for sensing when this power is at or near a minimum and for producing an output dependent on the relationship between said power and said minimum, which output is applied to the control input of said delay stage which is capable of providing a variable delay for controlling its delay period.

BRIEF DESCRIPTION OF THE DRAWINGS

The above and other features of the invention will now be described, by way of example, with reference to the accompanying drawings, in which.

DESCRIPTION OF THE PREFERRED EMBODIMENTS

Figure 1:
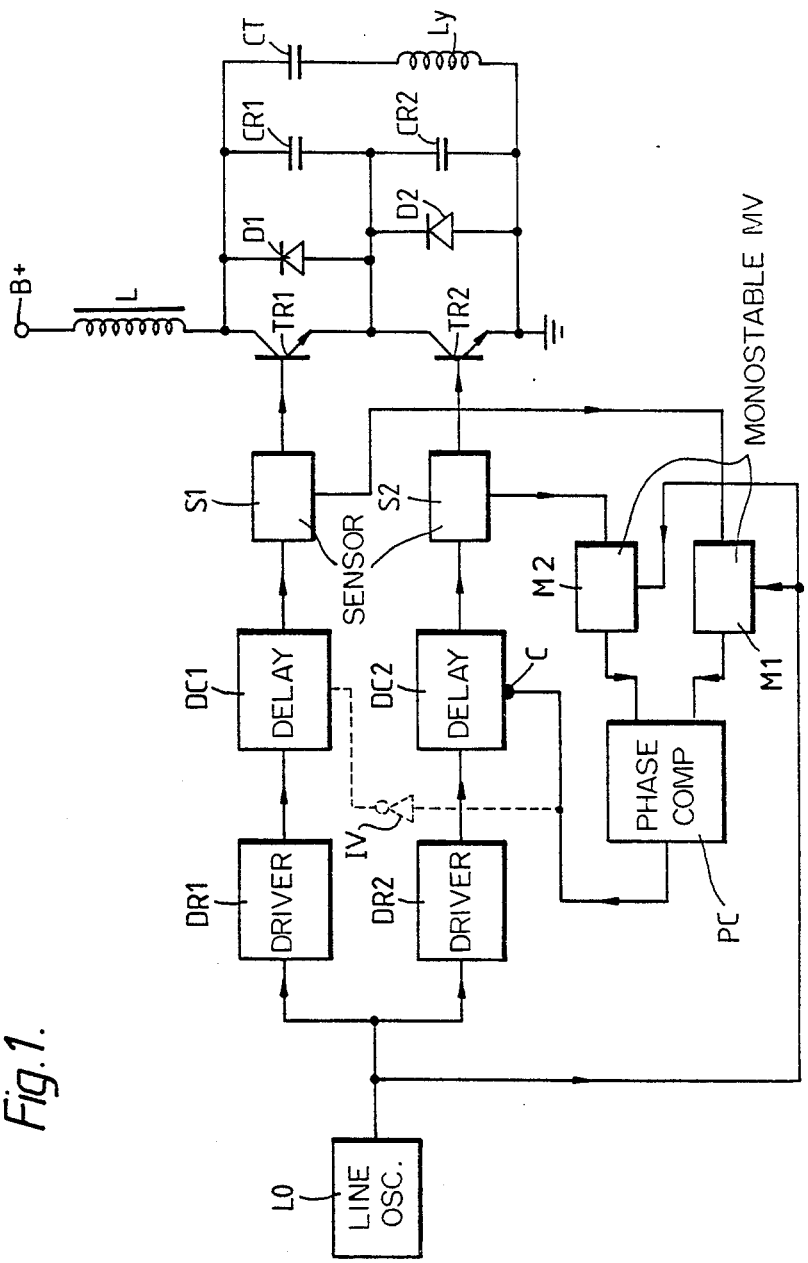
FIG. 1 is a diagram, partly n block form, of a first embodiment of a circuit arrangement according to the invention.

FIG. 1 is a diagram, partly in block schematic form, of a line deflection circuit having a line output stage for energising a line deflection coil Ly. The lin output stage comprises first and second high voltage npn bipolar power switching transistors TR1 and TR2 with the collector of transistor TR1 being connected to a voltage supply B+ through an inductor L while its emitter is connected to the collector of transistor TR2 whose emitter is connected to ground. The inductor L may be the primary of a transformer the secondary windings of which supply respectively the eht supply for the final anode of a display tube associated with the deflection circuit and the low voltage supply or supplies for other parts of the circuit. A diode D1 and a retrace capacitor CR1 are each connected in parallel with the transistor TR1 while a diode D2 and retrace capacitor CR2 are similarly connected in parallel with transistor TR2. A trace capacitor CT and the deflection coil Ly are serially connected between the collector of transistor TR1 and ground.

The line output stage operates in known manner with the voltage stored in trace capacitor CT producing the required sawtooth current through deflection coil Ly which initially flows through the diodes D1 and D2 for a first part of a trace period and subsequently through the transistors TR1 and TR2 for a second part of the trace period to produce the required sawtooth deflection current in the deflection coil Ly. The retrace period is initiated by rendering transistors TR1 and TR2 non-conducting by the negative going edge of the drive pulse which is applied to their bases, these transistors having been previously rendered conducting prior to or at the commencement of the second part of the trace period. During the retrace period the inductance and capacitance in the line output stage resonate to produce a half sine wave flyback pulse which is followed by the start of a further trace period. For optimum operation the two transistors TR1 and TR2 should become non-conducting simultaneously otherwise there will be unequal power sharing between the two transistors which could lead to the damage of one transistor, or at least the peak voltage will be reduced which in turn would reduce the eht supply when derived from this stage. Although both transistors may receive at the same time a signal to cut them off, simultaneous non-conduction may not be achieved as the storage times of the charge carriers in the transistors may not be equal and may vary with time and temperature. In order to ensure simultaneous non-conduction the transistors are driven in the manner as further described.

A line oscillator stage LO produces pulses at line frequency, which pulses are applied from its output to the respective inputs of a first (DR1) and a second (DR2) drive stage. The output of driver stage DR1 is applied to the input of a device DC1 having a characteristic which is used to control the cut-off signal for transistor TR1, the drive pulse from the device DC1 being applied via a first sensor S1 to the base of transistor TR1. In a similar manner the output of the second driver stage DR2 is applied to the input of a second device DC2 having a variable characteristic which is used to control the drive pulse for transistor TR2. The variation in the characteristic depends upon a signal applied to its control input C, the resulting drive pulse from the device DC2 being applied by a second sensor S2 to the base of transistor TR2. In one form the devices DC1 and DC2 may be delay stages where the characteristic is their delay period, that for device DC1 being fixed while that for device DC2 being variable. Each of the sensors S1, S2 senses the base current of its associated transistor TR1, TR2 and the resulting signal is applied to the input of an associated pulse generator in the form of a gated monostable multivibrator M1, M2. As each transistor TR1, TR2 becomes non-conducting there is a drop in its base current which is sensed by the sensors S1, S2 and applied to the associated monostable M1, M2 to trigger it into its non-stable state. In addition to the input from the sensor, each MV receives at a further input a gating pulse from the output of the oscillator LO to ensure that the multivibrator is not triggered by other pulses during the remaining part of the line period. The pulse outputs from the monostables M1, M2 are applied to respective inputs of a digital phase comparator PC in which the relative phases of the pulses are compared and a voltage produced whose amplitude depends on their phase difference. This voltage is applied from the output of the phase comparator PC to the control input C of the device DC2 with the variable characteristic which adjusts this characteristic to cause transistor TR2 to become simultaneously non-conducting with transistor TR1. Where the devices DC1 and DC2 are delay stages the delay period provided by device DC2 is varied to change, if necessary, the time at which the drive pulse is applied to the base of transistor TR2 with respect to that applied to the base of transistor TR1.

Figure 2:
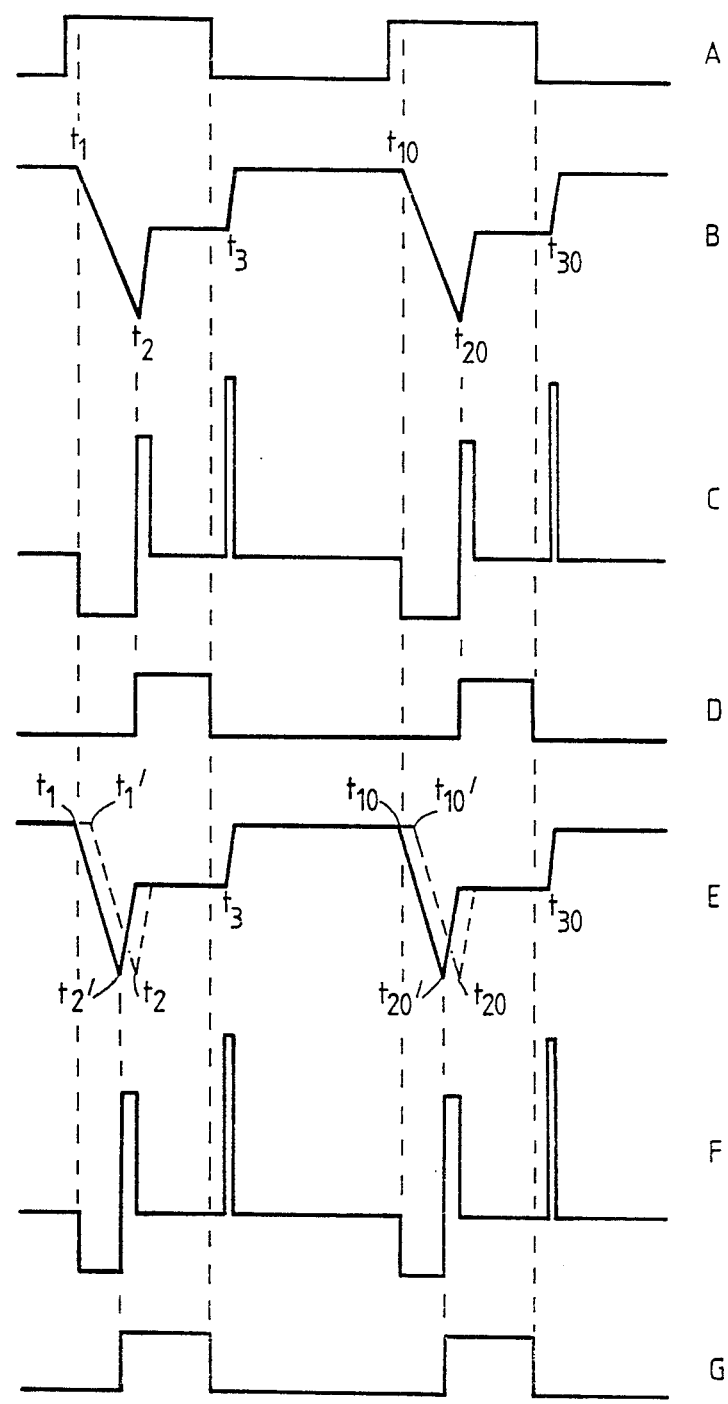
FIG. 2 shows various idealised waveforms associated with the operation of the circuit arrangement of FIG. 1.

FIG. 2 shows various idealised waveforms associated with the line deflection circuit of FIG. 1 when the devices DC1 and DC2 are delay stages. FIG. 2A shows the output of the line oscillator L0 used for driving the transistors TR1 and TR2 and also for gating the monostables M1 and M2. The base current for transistor TR1 is shown in FIG. 2B which starts to reduce in magnitude at times $t_1$, $t_{10}$ on receipt of the negative going drive pulse which is delayed by the delay stage DC1 and inverted by driver stage DR1 with respect to the pulse shown in FIG. 2A. The charge carriers in transistor TR1 are then removed with the base current reversing in polarity until times $t_2$, $t_{20}$ when the transistor comes out of saturation and the transistor is very rapidly cut-off to initiate the flyback period. At times $t_3$, $t_{30}$ during the following scan period transistor TR1 becomes forward biased when a positive pulse is applied to the base of this transistor and derived from the line oscillator pulse in FIG. 2A. This cycle is then repeated. FIG. 2C shows the voltage induced by the sensor S1, a sharp rise or fall in this voltage being produced with the changes in transistor TR1 base current. Monostable M1 is triggered by a positive going edge in the presence of a gating pulse (FIG. 2A), this condition occurring at times $t_2$, $t_{20}$ and the pulses produced at the output of monostable M1 are shown in FIG. 2D, these pulses being limited in duration by the negative going edge of the gating pulses.

The base current for transistor TR2 is shown in FIG. 2E which also starts to reduce at time $t_1$. It is assumed that initially the delay times of delay stages DC1 and DC2 are the same. It is assumed that the storage time for the charge carriers in transistor TR2 is shorter than that for the transistor TR1 and that transistor TR2 comes out of saturation at time $t_2'$. FIG. 2F shows the voltage induced by the sensor S2 and FIG. 2G the resulting pulses produced by monostable M2 which pulses are of longer duration than that for monostable M1. The relative phase of these two pulse outputs are compared in the phase comparator PC and the resulting control signal is used to increase the delay period produced by delay stage DC2 such that the negative going pulses are applied to the base of transistor TR2 at timess $t_1'$, $t_{10}'$ with the result that the times at which this transistor comes out of saturation are coincident with times $t_2$, $t_{20}$ for transistor TR1, this being shown in broken lines in FIG. 2E.

In the description of the arrangement of FIG. 1 the drive stages DR1, DR2 are placed before the devices DC1, DC2. It will be appreciated that in the case where these devices are delay stages it makes no difference to the operation if the delay stages precede the driver stages DR1, DR2. In addition, although only device DC2 is described as providing a variation of the device characteristic, it is possible to make the other device DC1 also variable which would be controlled by a complementary control signal from the phase comparator PC such that as the characteristic of device DC2 is changed in one direction the characteristic of device DC1 is changed in the other direction. This can be done by adding an inverter stage IV between the output of the phase comparator PC and a control input of the device DC1 (show by dashline in FIG. 1) With such an arrangement the degree of characteristic variation can be less than that provided by device DC2 when that is the only one which is variable.

Figure 3:
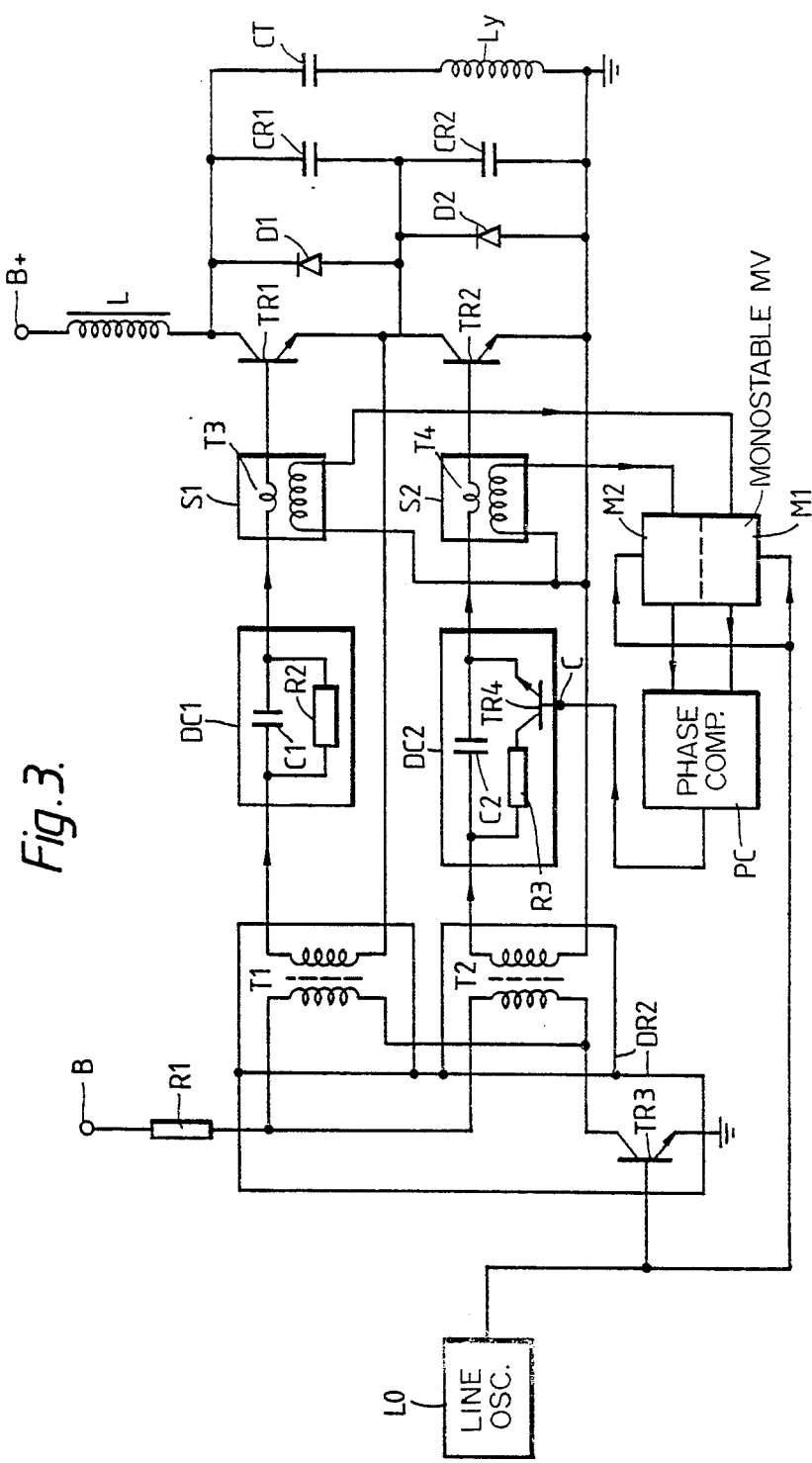
FIG. 3 is a modified diagram of the circuit arrangement of FIG. 1.

FIG. 3 shows in more detail parts of the line deflection circuit shown in FIG. 1, corresponding reference symbols indicating like components in the two figures. In FIG. 3 the drive stages DR1, DR2 are formed by a driver transistor TR3 whose base is connected to the output of the line oscillator L0 while its emitter is connected to ground. The collector of transistor TR3 is connected through the primary windings, connected in parallel, of respective driver transformers T1, T2 and a resistor R1 to the positive terminal of a low voltage supply B. The lower end of the secondary winding of transformer T1 is connected to the junction between transistors TR1 and TR2 and its upper end is connected to the input of device DC1 which consists of a capacitor C1 connected in parallel with a resistor R2. In this case the characteristic controlled by the device DC1 is the amplitude of the forward drive base current. The resistor R2 and capacitor C1 together with the leakage inductance of transformer T1 are selected to provide the required drive for transistor TR1. The sensor S1 comprises a current transformer T3 with a primary winding (which may in practice be a straight conductor) connected between the device DC1 and the base of transistor TR1. The lower end of the secondary winding of transformer T2 is connected to earth ground and is upper end is connected to the input of device DC2 which comprises a capacitor C2 connected in parallel with the series arrangement of a resistor R3 and a npn transistor TR4 which together with the leakage inductance of transformer T2 are selected to provide the drive for transistor TR2. The base of transistor TR4 forms the control input C for this device. Sensor S2 takes the same form as sensor, i.e. transformer T4 with the primary winding connected between the device DC2 and the base of transistor TR2. One end of the secondary windings of each of the transformers T3 and T4 are connected to earth while the other end of each secondary winding is connected to their associated monostable M1, M2, which in this case take the form of a dual monostable multivibrator. The output of the phase comparator PC controls the degree of conduction of transistor TR4 and hence its resistance to vary the amplitude of the drive pulse at the base of transistor TR2.

Figure 4:
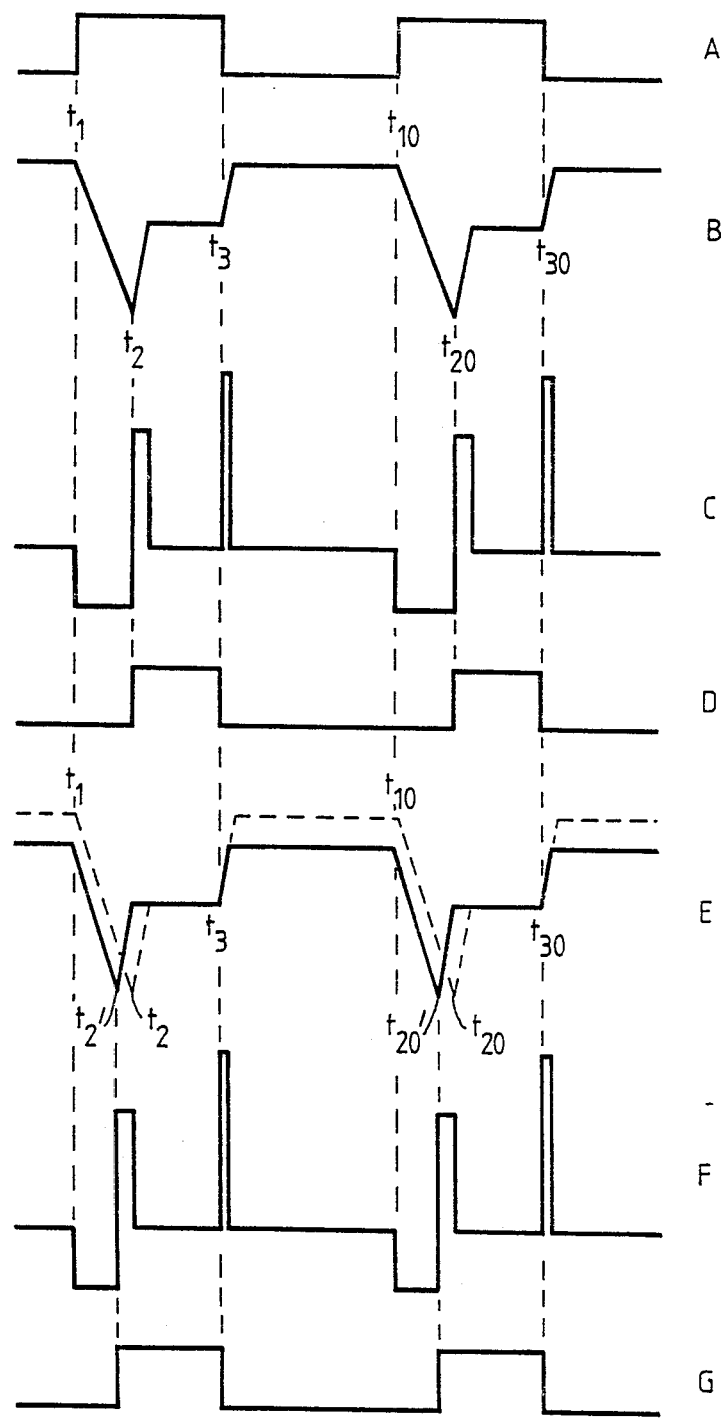
FIG. 4 shows various idealised waveforms associated with the operation of the circuit arrangement of FIG. 3.

FIG. 4 shows various waveforms associated with the line deflection circuit of FIG. 3, the waveforms in FIGS. 4A to 4G corresponding to the waveforms in FIGS. 2A to 2G. As there is no intended delay in the paths between the line oscillator L0 and the bases of transistors TR1 and TR2 these transistors commence turn off at the same time. It is assumed initially that the amplitude of the drive current from device DC1 is the same as that from device DC2 and that with such a current the storage time for the charge carriers in transistor TR2 is shorter than that for transistor TR1. As a result transistor TR1 comes out of saturation at times $t_2$, $t_{20}$ while transistor TR2 comes out of saturation at the earlier times of $t_2'$, $t_{20}'$. As a result of this there is a phase difference between the outputs of the monostables M1 and M2 as shown in FIGS. 4D and 4G respectively. This difference is compared in the phase comparator PC and the resulting control signal is applied to the control input of the amplitude control device DC2.

The drive current applied to the base of a line output transistor (TR1, TR2) has an effect on the quantity of charge carriers in the transistor and when the drive current is in excess of that required to cause the transistor to just saturate the transistor contains an excess of charge carriers and the storage time required to remove these charge carriers at transistor cut-off is increased. In the case of the high voltage bipolar switching transistors it is normal for the drive current to be greater than that required for a nominal transistor to be just saturated in order to cater for the spread in characteristics found with transistors of the same type, though the drive current should not be excessively great as to cause control errors. It will be appreciated that due to the spreads in these characteristics the storage times for two transistors when driven with the same drive current may differ as shown in FIGS. 4B and 4E. With the arrangement of FIG. 3 the output from the phas comparator PC is arranged to control the amplitude control device DC2 such that the forward drive current applied to the base of transistor TR2 during each scan period is increased by reducing the resistance presented by transistor TR4. This will increase the quantity of charge carriers in the transistor and so increase the storage time until it corresponds to that of transistor TR1. This is shown by the broken lines in FIG. 4E. In this way the storage times of the transistors TR1 and TR2 are equalised and these two transistors become non-conducting simultaneously.

Figure 5:
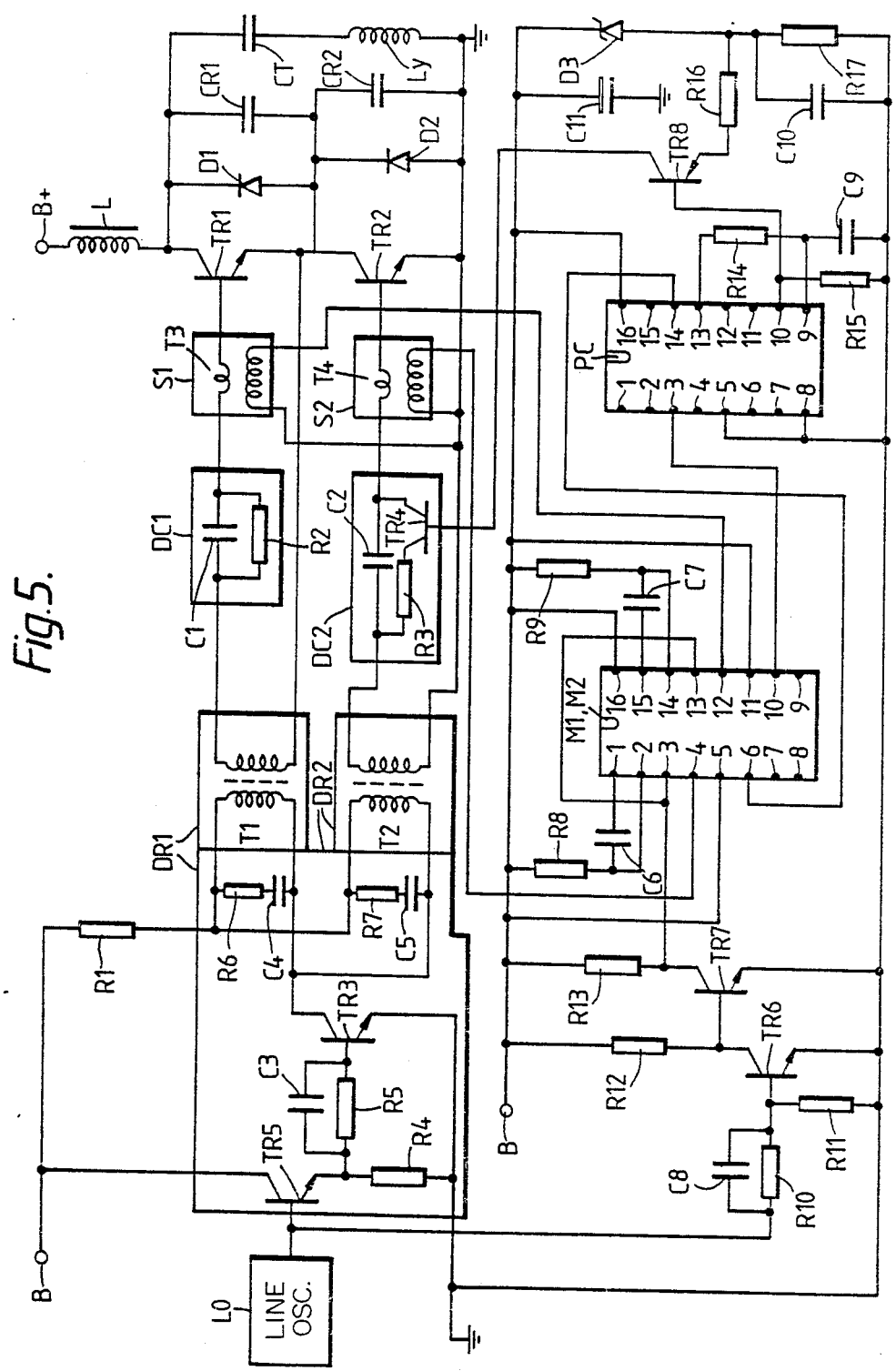
FIG. 5 is a more detailed diagram of the circuit arrangement as shown in FIG. 3.

FIG. 5 is a more detailed diagram of the line deflection circuit shown n FIG. 3, corresponding reference symbols again indicating like components in the two figures. Only those parts of the circuit which differ from FIG. 3 will be described. The output of the line oscillator L0, which may be formed by a suitable integrated circuit, is connected to the base of an npn emitter follower stage transistor TR5 whose emitter is connected through the parallel arrangement of a capacitor C3 and a resistor R5 to the base of driver transistor TR3. The emitter of transistor TR5 is also connected through a resistor R4 to earth ground and its collector is connected to the positive supply rail B which may be at 12 volts. The primary winding of each driver transformer T1, T2 is shunted by the series arrangement of a capacitor and a resistor providing damping (C4, R6 in the case of T1 and C5, R7 in the case of T2). The gated dual monostable multivibrator M1, M2 is an integrated circuit of type HEF 4528B data for which can be found in the Philips Data Handbook, Integrated circuits, Part 4, July 1983, Digital Integrated Circuits—CMOS, pages 551 to 556, the pin numbers and designations used in FIG. 5 corresponding with those used in the published data. A timing capacitor C6 is connected between pins 1 and 2 ($C_{TCA}$ and $RC_{TCA}$) and a resistor R8 is connected between pins 2 and 16 via the B supply rail ($C_{TCA}$ and $V_{DD}$). The natural duration of the output pulse from the monostable M1 which appears at pin 6 ($O_A$) (in the absence of the gating pulse) is determined by capacitor C6 and resistor R8. In a similar manner a capacitor C7 is connected between pins 14 and 15 ($C_{TCB}$ and $RC_{TCB}$) and a resistor R9 between pins 14 and 16 ($C_{TCB}$ and $V_{DD}$). The natural duration of the output pulse from the monostable M2 which appears at pin 10 ($O_B$) is determined by capacitor C7 and resistor R9.

The gating pulses for the monostables M1, M2 are derived from the local oscillator LO output which is connected via the parallel arrangement of a capacitor C8 and a resistor R10 to the base of an npn transistor TR6, this base also being connected to ground by way of resistor R11. The collector of transistor TR6 is connected through a resistor R12 to the B supply rail and directly to the base of a further npn transistor TR7 whose emitter is connected to ground as is the emitter of transistor TR6. The collector of transistor TR7 is connected through a resistor R13 to the B supply rail and supplies buffered gating pulses of the correct polarity directly to pin 3 ($\overline{C}_{DA}$) for monostable M1 and pin 13 ($\overline{C}_{DB}$) for monostable M2.

The digital phase comparator PC is formed by part of a phase-locked loop integrated circuit type HEF 4046B data for which can be found in the above Philips Data Handbook between pages 285 and 298, the pin numbers and designations used in FIG. 5 corresponding with those used in the published data. Monostable M1 output at pin 6 is applied to pin 14 ($SIGN_{IN}$) of phase comparator PC while monostable M2 output at pin 10 is applied to pin 3 ($COMP_{IN}$). Pins 5 and 8 (INH and $V_{SS}$) are connected to ground while pin 16 ($V_{DD}$) is connected to supply rail B. Pins 13 and 9 ($PC2_{OUT}$ and $VCO_{IN}$) are interconnected by a resistor R14 while the latter pin is connected through a capacitor C9 to ground, capacitor C9 and resistor R14 forming a low pass filter. The voltage controlled oscillator part of this integrated circuit is not used. The output of the comparator is taken from pin 10 ($SF_{OUT}$) which is connected to ground through a load resistor R15 and directly to the base of a pnp transistor TR8. The emitter of transistor TR8 is connected through a resistor R16 to a reference voltage point on a divider comprising a zener diode D3 and a resistor R16 connected between the B supply rail and ground, resistor R17 being decoupled by a parallel capacitor C10. The collector of transistor TR8 is directly connected to the base of transistor TR4 and provides the control votlage to control the conduction of transistor TR4 to vary its resistance and hence the amplitude of drive pulse for transistor TR2 to ensure that this transistor becomes non-conducting simultaneously with transistor TR1.

Figure 6:
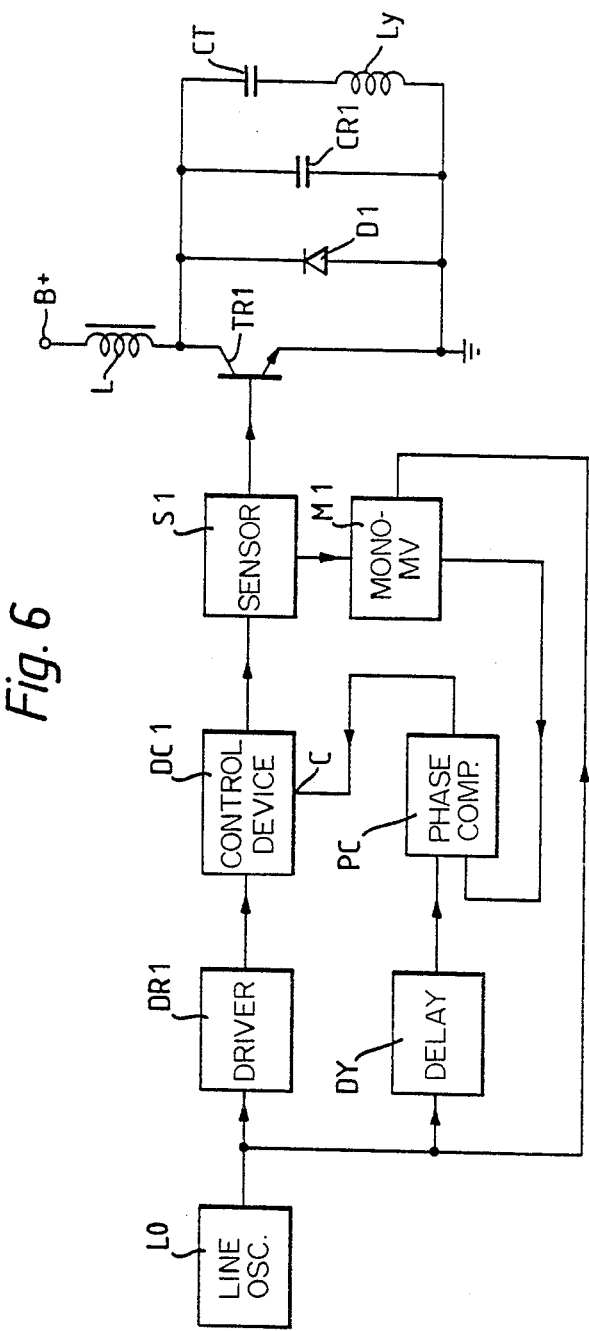
FIG. 6 is a diagram, partly in block form, of a further embodiment of a circuit arrangement according to the invention.

The embodiments of the invention so far illustrated and described have related to stages employing two serially connected bipolar transistors where there is a need to ensure that both transistors are cut-off substantially simultaneously. FIG. 6 shows a further embodiment of the invention which uses a single high voltage npn bipolar power switching transistor (TR1) and where it is desired to control the cut-off of this transistor with a specified relationshiP to the output of the line oscillator (LO). In FIG. 6 corresponding references to those employed in FIG. 1 are used to indicate like components. Unlike FIG. 1, in FIG. 6 the emitter of transistor TR1, the anode of diode D1 and the lower plate of retrace capacitor CR1 are all connected to ground and the lower terminal of deflection coil Ly. In operation the voltage stored in trace capacitor CT produces the required sawtooth current through the deflection coil Ly which initially flows through the diode D1 for a first part of a trace period and subsequently through transistor TR1 for the remaining part of the trace period. The retrace period is initiated at the instant when transistor TR1 becomes non-conducting and during the retrace period the inductance and capacitance in the line output stage resonate to produce the half sine wave flyback pulse which is followed by the start of a further trace period. The time at which the flyback pulse commences depends on the charge storage time of transistor TR1 as will be described below. With displays, such as those for data graphics with a high line frequency, e.g. 64 KHz, it is desirable for the flyback pulse to commence as soon as possible after the removal of the drive pulse from the base of transistor TR1. Although the transistor normally selected for such a line output stage is chosen to have a short charge storage time (of the order of 2 to 3 microseconds) the storage time for a particular transistor may vary with time for various reasons. This will produce a phase movement with respect to its drive which is visible on the display screen in the absence of a complicated phase locked loop. This can be overcome in the manner to be described.

The drive for transistor TR1 is the same as that for FIG. 1 and uses the line frequency signal source LO, the driver stage DR1, the drive pulse control device DC1 and the sensor S1. The change of current sensed by sensor S1 is again applied to the pulse generator M1 which also receives at a further input the gating pulse from the output of signal source LO, the resulting pulse output from the monostable M1 being applied to the first input of the phase comparator PC. The output of the signal source LO is also applied to a delay stage DY where it is delayed by a finite period which can correspond to the nominal charge storage time for the transistor TR1 as given in the data for such a transistor. Alternatively delay stage DY may be adjustable and preset to produce a delay corresponding to the charge storage time of the transistor for TR1 actually in use. The delayed output from the delay stage DY is applied to the second input of the phase comparator PC where the phase of the two inputs are compared and the resulting output applied to control the control device DC1 which has the control input C. The manner of operation will be described with reference to FIG. 7.

Figure 7:
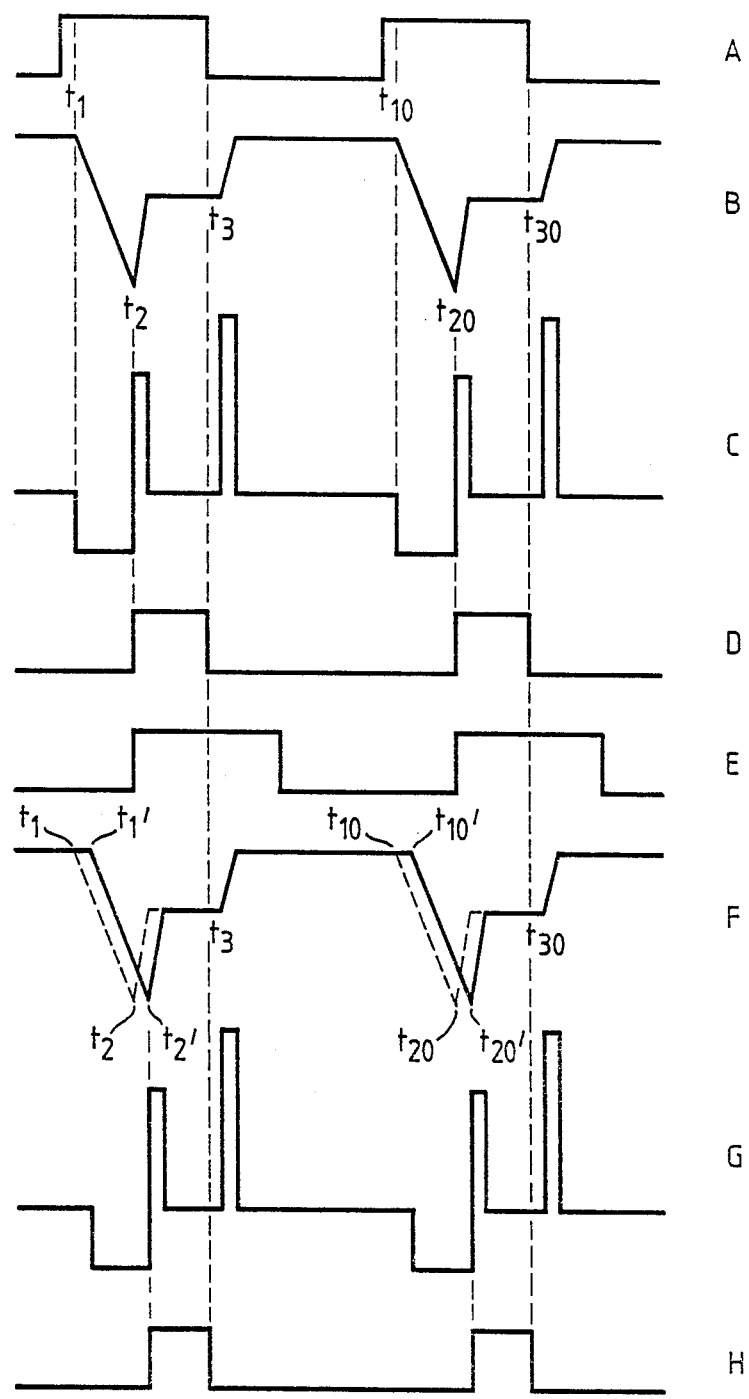
FIG. 7 shows various waveforms associated with the operation of the arrangement of FIG. 6.

FIG. 7 shows various idealised waveforms associated with the line deflection circuit of FIG. 6 when the device DC1 is a variable delay device and the characteristic of the drive pulse is its relative time. FIGS. 7A to 7D correspond to and are identical with FIGS. 2A to 2D and will not further be described. The line pulses from the signal source LO delayed by the delay stage DY are shown in FIG. 7E and from a comparison of FIGS. 7D and 7E it will be seen that the leading edge of these pulses are coincident and the output of phase comparator PC is such that it does not change the delay period of delay device DC1.

The base current for transistor TR1 is shown in FIG. 7F where there is a change in phase such that it starts to reduce at the later times of $t_1'$, $t_{10}'$. FIG. 7G shows the resulting voltage induced by the sensor S1 and FIG. 7H the resulting pulses produced by monostable M1, which pulses are of shorter duration than in FIG. 7D. The relative phase of the pulses in FIGS. 7E and 7H are compared in the phase comparator PC and the resulting control signal is used to reduce the delay period produced by delay device DC1, which in this case is variable, such that the negative going pulses of the drive signal are again applied to the base of transistor TR1 at times $t_1$, $t_{10}$ with the result that the initial phase relationship is restored as shown in broken line portions in FIG. 7F.

Figure 8:
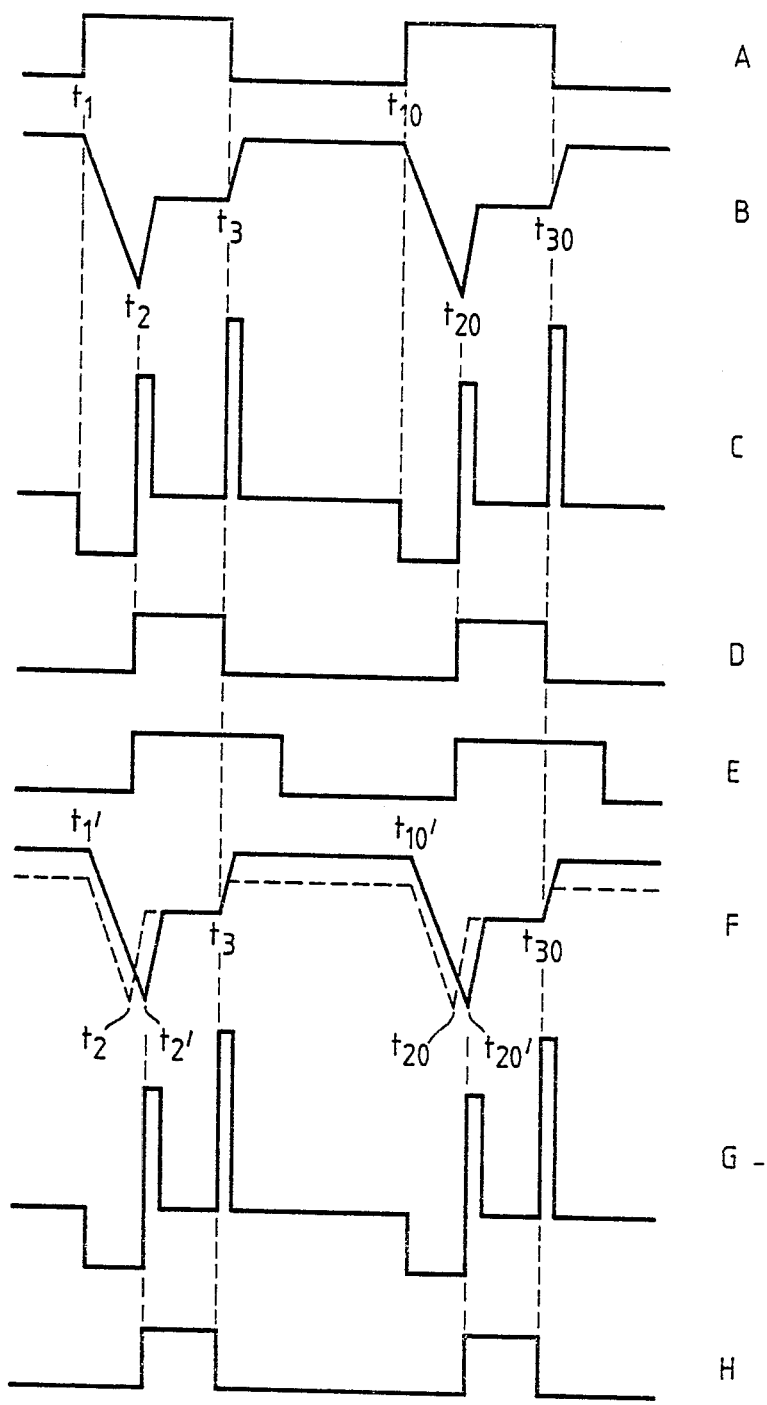
FIG. 8 shows various waveforms associated with an alternative operation of the arrangement of FIG. 6.

As an alternative to the device DC1 being a controlled variable delay device the device, DC1 may be one in which the characteristic controlled is the amplitude of the forward base current. In such a case the amplitude control device DC1 may take the form of the device DC2 shown in FIG. 3. FIG. 8 show various waveforms associated with the line deflection circuit of FIG. 6 using such an amplitude control device, the waveforms in FIGS. 8A to 8D corresponding to and being identical with the waveforms in FIGS. 4A to 4D and will not further be described. FIG. 8E shows the delayed line pulse which corresponds with that shown in FIG. 7E. FIG. 8F shows the situation where there is a change in phase such that the base current for transistor TR1 starts to reduce at the later time of $t_1'$, $t_{10}'$ with the result that the voltage induced by the sensor S1 is produced later, as shown in FIG. 8G, and the pulses from the monostable M1 are shorter as shown in FIG. 8H. The full line waveform in FIG. 8F and the waveforms in FIG. 8G and 8H are identical to the corresponding waveforms in FIGS. 7F, 7G and 7H save again for the delay. As before the relative phase of the pulses in FIGS. 8E and 8H are compared in the phase comparator PC and the resulting control signal is used to control the device DC1. In this case the amplitude of the applied forward drive pulse is reduced to reduce the charge stored in the transistor TR1 and so reduce its charge storage time. This is shown in broken line form in FIG. 8F where it will be seen that while the charge carriers in transistor TR1 start to leak away at $t_1'$, $t_{10}'$ the base current reverses its polarity at $t_2$, $t_{20}$ due to the reduced stored charge and the required phase relationship is restored.

Figure 9:
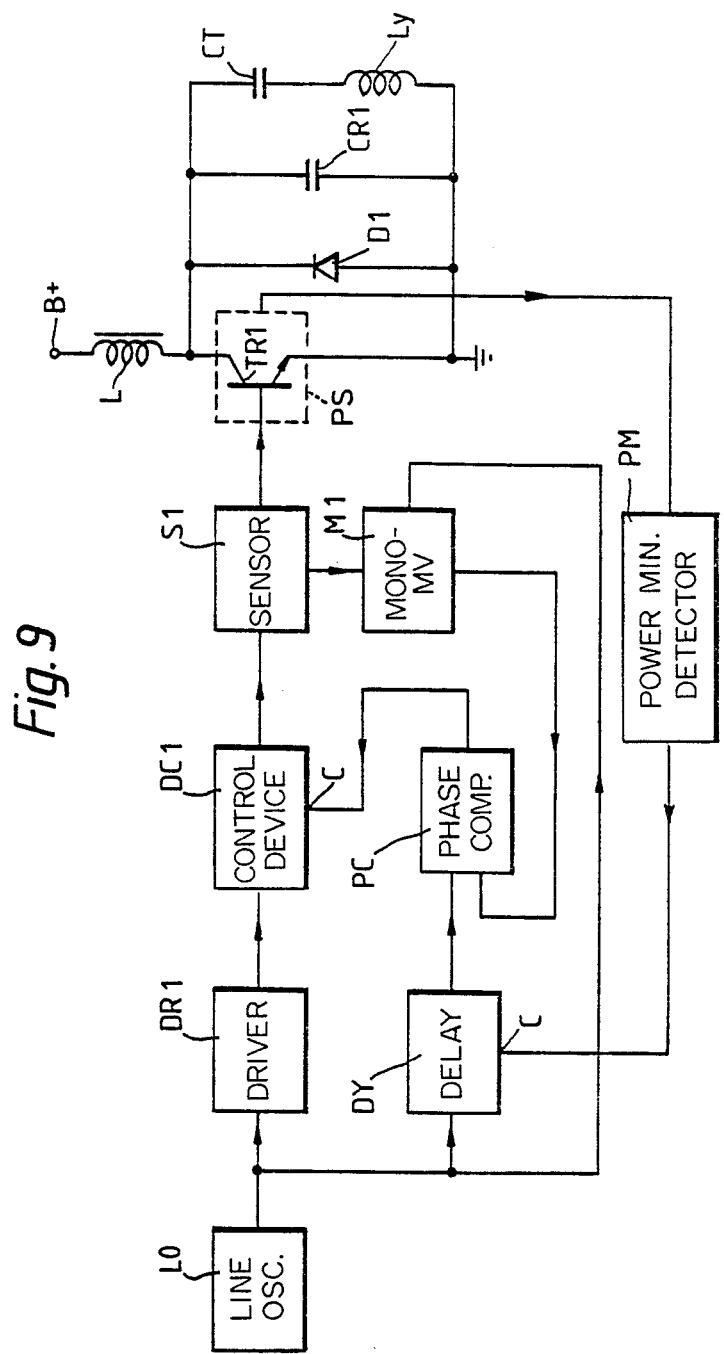
FIG. 9 is a modification of the embodiment shown in FIG. 6.

FIG. 9 is a diagram, partly in block schematic form, of a modification of the line deflection circuit shown in FIG. 6, corresponding references indicating like components in the two Figures. FIG. 9 differs from FIG. 1 in that it includes a power sensor PS for determining the relative power in the transistor TR1. This power sensor PS is shown as a broken line box surrounding the transistor and may in one form comprise a device in thermal contact with the transistor to measure its temperature which will increase with an increase of power in the transistor. The output of the power sensor PS is applied to the input of a power minimum detector PM which looks for the minimum power in transistor TR1. The output of the power minimum detector PM is connected to a control input C of the delay stage DY which in this case is a device which can produce a delay period which is variable under the control of a control signal present at its control input C. In addition the device DC1 is a device which controls the amplitude of the forward base current for transistor TR1 as previously described.

The operation of the circuit of FIG. 9 is identical to that as described in relation to FIG. 8 with the addition that a signal corresponding to the power in transistor TR1 produced by the power sensor PS is applied to the input of the power minimum detector PM. This detector looks for a minimum power in the transistor TR1 and produces an output which is applied to the control input C of the delay stage DY to change its delay period if the above power is not at a minimum. As this delay period is changed so is the time at which the pulses in FIG. 8E appear, as a result of which the phase comparator PC causes a change in the amplitude of the forward drive current applied to the base of transistor TR1 and hence the charge storage time of this transistor. This continues until the optimum power transistor TR1 is reached, at which time the delay provided by delay stage DY is substantially equal to the charge storage time required for minimum power dissipation.

Although in the description of FIG. 9 the power sensor PS is described as being a temperature sensor, it could instead sense various voltage(s) and/or current(s) at electrodes of transistor TR1 to allow the power in that transistor to be detected. As an alternative the total supply current to the transistor TR1 stage may be sensed to provide an indication of the power and one way that this may be achieved is the inclusion of a resistor of small value between the emitter of transistor TR1 and ground with a capacitor of large value to convey the components at line frequency in parallel with the resistor. In such a case the voltage across the resistor represents the power. This voltage is applied to the power minimum detector PM which operates as a voltage minimum detector. Also the sensor S1 and monostable M1 producing the pulse when transistor TR1 is rendered non-conducting in FIGS. 6 and 9 may be replaced by a connection from a winding on a transformer forming the inductor L in the collector circuit of transistor TR1 which provides flyback pulses.

We claim:

1. A circuit arrangement comprising: a first high voltage bipolar power transistor, first control means for repeatedly cutting-off said first transistor, means connecting said first control means to a signal source which produces a drive signal for said first transistor, said first control means comprising a first device having an electric characteristic which controls said drive signal, a comparison stage having an output coupled to said first device for controlling the electric characteristic of said first device, first sensor means coupled to said first transistor for sensing the rate of change of base current of said first transistor each time said first transistor is cut off, first means for applying a sensing signal so produced to a first input of said comparison stage, second means for applying a time-related signal to a second input of the comparison stage, said first device controlling the instant of cut-off of said first transistor in response to a resulting comparison between said sensing signal and said time-related signal.

2. A circuit arrangement as claimed in claim 1, further comprising a second high voltage bipolar power transistor serially connected with said first transistor, second control means for repeatedly cutting off said second transistor, means connecting the second control means to said signal source for producing a drive signal for said second transistor, said second control means comprising a second device having an electric characteristic corresponding to that of said first device and which controls the drive signal for said second transistor, characterized in that said circuit arrangement additionally comprises second sensor means coupled to said second transistor for sensing the rate of change of base current of said second transistor each time said second transistor is cut-off thereby to derive a second sensing signal, and wherein said second means for applying applies the second sensing signal to said second input of said comparison stage as said time-related signal, said comparison stage comparing the phase relationship between said first and second sensing signals to produce the control for the electric characteristic of said first device to ensure that said first and second transistors are cut-off substantially simultaneously.

3. A circuit arrangement as claimed in claim 2, characterised in that said comparison stage additionally controls the electric characteristic of the second device.

4. A circuit arrangement as claimed in claim 2, characterized in that said first and second sensor means are each connected to a respective input of the comparison stage via a respective first and second pulse generator for producing a discrete pulse for said comparison stage each time its respective first and second transistor is cut-off.

5. A circuit arrangement as claimed in claim 4, wherein said second means for applying comprises a delay stage for coupling pulses from said signal source to the second input of said comparison stage.

6. A circuit arrangement as claimed in claim 2 further comprising a line deflection coil and a serially connected capacitor of a video display device coupled across said first and second high voltage bipolar power transistors.

7. A circuit arrangement as claimed in claim 1, wherein said second means for applying applies pulses from said signal source to the second input of said comparison stage to form said time related signal.

8. A circuit arrangement as claimed in claim 7, further comprising a delay stage for coupling pulses from said signal source to the second input of said comparison stage.

9. A circuit arrangement as claimed in claim 8 wherein said first device controls the amplitude of drive signal applied to the base of said first power transistor thereby to control transistor charge carrier storage time.

10. A circuit arrangement as claimed in claim 9, characterised in that it additionally comprises means for sensing the power in said first high voltage bipolar power transistor, means for sensing when said power is at or near a minimum and for producing an output signal dependent on said power minimum, said output signal being applied to a control input of said delay stage which provides a variable delay for controlling its delay period.

11. A circuit arrangement as claimed in claim 2, characterized in that each said first and second device controls the amplitude of the drive signal applied to the base of its respective transistor to control charge carrier storage time for that transistor.

12. A circuit arrangement as claimed in claim 11, characterised in that the comparison stage controls the first device to substantially equalize the charge carrier storage times of the first and second transistors.

13. A circuit arrangement as claimed in claim 11, characterised in that each amplitude control device comprises a capacitor and a parallel resistive path, the resistive path in the first device comprising a further transistor whose conductivity is controlled by said comparison stage.

14. A circuit arrangement as claimed in claim 2 characterised in that each said first and second device is a delay device, the delay period of the first device being varied under the control of said comparison stage.

15. A circuit arrangement as claimed in claim 1 wherein the first sensor means is connected to a pulse generator which produces a discrete pulse for said comparison stage each time the first transistor is cut-off.

16. A circuit arrangement as claimed in claim 1 wherein said first device comprises a delay device having its delay period varied under control of said comparison stage.

17. A circuit arrangement as claimed in claim 1 wherein said first device controls the amplitude of drive signal applied to the base of the first power transistor thereby to control transistor charge carrier storage time, and wherein the first device comprises a capacitor and a parallel resistive path, the resistive path in the first device comprising a further transistor whose conductivity is controlled by said comparison stage.

18. A circuit arrangement as claimed in claim 1 wherein said first device controls the amplitude of drive signal applied to the base of said first power transistor thereby to control transistor charge carrier storage time.

19. A circut arrangement as claimed in claim 1 further comprising a line deflection coil of a video display device coupled to said first high voltage bipolar power transistor.

* * * * *